US011631960B2

(12) United States Patent
Du et al.

(10) Patent No.: US 11,631,960 B2
(45) Date of Patent: Apr. 18, 2023

(54) OPTICAL MODULE (71) Applicant: HISENSE BROADBAND MULTIMEDIA TECHNOLOGIES CO., LTD., Shandong (CN)

(72) Inventors: Guangchao Du, Shangdong (CN); Yongzheng Tang, Shandong (CN); Tao Wu, Shandong (CN); Jianwei Mu, Shandong (CN); Shaoshuai Sui, Shandong (CN); Jihong Han, Shandong (CN); Sitao Chen, Shandong (CN); Qian Shao, Shandong (CN)

(73) Assignee: HISENSE BROADBAND MULTIMEDIA TECHNOLOGIES CO., LTD., Qingdao (CN)

( * ) Notice: Subject to any disclaimer, the term of this patent is extended or adjusted under 35 U.S.C. 154(b) by 265 days.

(21) Appl. No.: 16/892,032

(22) Filed: Jun. 3, 2020

(65) Prior Publication Data
US 2020/0295528 A1 Sep. 17, 2020

Related U.S. Application Data (63) Continuation of application No. PCT/CN2019/127213, filed on Dec. 20, 2019.

(30) Foreign Application Priority Data

Dec. 20, 2018 (CN) .......................... 201811563574.4
Dec. 20, 2018 (CN) .......................... 201811592719.3

(51) Int. Cl.
H01S 5/024 (2006.01)
H01S 5/02253 (2021.01)
(Continued)

(52) U.S. Cl.
CPC .......... H01S 5/02469 (2013.01); H01S 5/024 (2013.01); H01S 5/02253 (2021.01);
(Continued)

(58) Field of Classification Search
CPC .... H01S 5/023–02326; H01S 5/02469–02492; H01S 6/4266–4273;
(Continued)

(56) References Cited

U.S. PATENT DOCUMENTS 5,319,725 A * 6/1994 Buchmann ............... G02B 6/43
385/14
5,432,878 A * 7/1995 Smous ................. G02B 6/4236
385/52
(Continued)

FOREIGN PATENT DOCUMENTS

CN 102385124 A 3/2012
CN 102569431 A 7/2012
(Continued)

OTHER PUBLICATIONS

First Chinese Office Action regarding Application No. 201811592719.3 dated Mar. 27, 2020. English translation provided by Chinable IP.
(Continued)

Primary Examiner — Joshua King
(74) Attorney, Agent, or Firm — Harness, Dickey & Pierce, P.L.C.

(57) ABSTRACT

This application provides an optical module, and relates to the field of optical communication. An optical module provided in the embodiments of this application includes a laser box and a silicon photonic chip that are enclosed and packaged by an upper enclosure part and a lower enclosure part. The laser box is disposed on and is in contact with the surface of the silicon photonic chip by the side wall or the base. The laser chip is disposed on the top plane of the laser (Continued)

box. The top plane is in contact with the upper enclosure part for heat dissipation, so as to help heat generated by the laser chip be conducted to the upper enclosure part via the top plane, so that the heat generated by the laser chip is dissipated not via the silicon photonic chip.

11 Claims, 6 Drawing Sheets

(51) Int. Cl.
- H01S 5/02326 (2021.01)
- H01S 5/02345 (2021.01)
- H01S 5/02325 (2021.01)
- H01S 5/02255 (2021.01)
- H01S 5/00 (2006.01)

(52) U.S. Cl.
CPC ...... *H01S 5/02255* (2021.01); *H01S 5/02325* (2021.01); *H01S 5/02326* (2021.01); *H01S 5/02345* (2021.01); *H01S 5/005* (2013.01); *H01S 5/0064* (2013.01)

(58) Field of Classification Search
CPC ... H01S 6/4214; H01S 5/02208–02235; H01S 5/0237; H05K 2201/1012; H05K 1/0274; G02B 6/12–12033; G02B 2006/12035–12197; G02B 6/0085
See application file for complete search history.

(56) References Cited

U.S. PATENT DOCUMENTS

| | | | | |
|---|---|---|---|---|
| 5,675,685 | A * | 10/1997 | Fukuda | H01S 5/4025 257/98 |
| 6,422,766 | B1 * | 7/2002 | Althaus | G02B 6/4259 385/94 |
| 6,485,197 | B1 * | 11/2002 | Kato | G02B 6/4248 385/94 |
| 6,563,696 | B1 * | 5/2003 | Harris | H05K 3/325 174/16.3 |
| 6,586,678 | B1 * | 7/2003 | Rosenberg | H01S 5/02212 257/E23.19 |
| 6,703,561 | B1 * | 3/2004 | Rosenberg | H01S 5/02212 174/541 |
| 6,793,407 | B2 * | 9/2004 | Jacobowitz | G02B 6/43 385/139 |
| 6,856,717 | B2 * | 2/2005 | Kilian | G02B 6/4206 385/47 |
| 6,940,723 | B2 * | 9/2005 | Ice | G02B 6/4283 361/709 |
| 6,950,314 | B2 * | 9/2005 | Reznik | H01R 12/62 361/764 |
| 6,969,204 | B2 * | 11/2005 | Kilian | G02B 6/4214 385/94 |
| 7,039,083 | B2 * | 5/2006 | Carroll | H01S 5/042 372/36 |
| 7,210,859 | B2 * | 5/2007 | Kumar | H01S 5/02212 257/E23.19 |
| 7,907,803 | B2 * | 3/2011 | Hodono | G02B 6/138 156/305 |
| 9,058,971 | B2 | 6/2015 | Shih et al. | |
| 9,148,226 | B2 * | 9/2015 | Sato | G02B 6/4271 |
| 9,548,817 | B1 * | 1/2017 | Nagarajan | G02B 6/4271 |
| 9,588,313 | B2 * | 3/2017 | Kimura | G02B 6/4246 |
| 10,215,919 | B2 | 2/2019 | Collins et al. | |
| 2004/0037519 | A1 * | 2/2004 | Kilian | G02B 6/423 385/94 |
| 2004/0101259 | A1 * | 5/2004 | Kilian | G02B 6/4214 385/93 |
| 2005/0254537 | A1 | 11/2005 | Su et al. | |
| 2005/0265650 | A1 * | 12/2005 | Priyadarshi | H05K 1/148 385/14 |
| 2010/0038670 | A1 * | 2/2010 | Panaccione | H01L 33/486 438/27 |
| 2012/0063718 | A1 * | 3/2012 | Steijer | G02B 6/4269 385/14 |
| 2012/0128290 | A1 * | 5/2012 | Han | G02B 6/4281 385/14 |
| 2012/0205524 | A1 * | 8/2012 | Mack | G02B 6/4208 250/225 |
| 2014/0029639 | A1 * | 1/2014 | Zarbock | G02B 6/4269 372/50.1 |
| 2014/0192832 | A1 | 7/2014 | Shih et al. | |
| 2014/0203175 | A1 * | 7/2014 | Kobrinsky | G02B 6/12004 250/214.1 |
| 2015/0318664 | A1 * | 11/2015 | Eckert | H01S 5/02234 29/841 |
| 2015/0370020 | A1 | 12/2015 | Engel et al. | |
| 2016/0116688 | A1 * | 4/2016 | Hochberg | G02B 6/4232 385/14 |
| 2016/0294157 | A1 * | 10/2016 | Lee | H01S 5/02325 |
| 2017/0017050 | A1 * | 1/2017 | Gamache | G02B 6/4251 |
| 2017/0054269 | A1 * | 2/2017 | Tamura | H01S 5/02345 |
| 2017/0097479 | A1 * | 4/2017 | Oomori | H05K 1/0274 |
| 2017/0122505 | A1 * | 5/2017 | Kiyota | F21K 9/64 |
| 2017/0126323 | A1 * | 5/2017 | Gudeman | H01S 5/02255 |
| 2017/0170627 | A1 * | 6/2017 | Furuya | H01S 5/02257 |
| 2017/0237228 | A1 * | 8/2017 | Gudeman | H01S 5/02255 372/26 |
| 2017/0293094 | A1 * | 10/2017 | Gamache | G02B 6/4206 |
| 2017/0343734 | A1 | 11/2017 | Collins et al. | |
| 2018/0166850 | A1 * | 6/2018 | Gudeman | H01S 5/02216 |
| 2018/0188448 | A1 * | 7/2018 | Yim | H01L 23/3675 |
| 2018/0331493 | A1 * | 11/2018 | Lin | H01S 5/0234 |

FOREIGN PATENT DOCUMENTS

| | | | | |
|---|---|---|---|---|
| CN | 103368064 A | * | 10/2013 | ............ F21V 7/00 |
| CN | 103915402 A | | 7/2014 | |
| CN | 205232234 U | | 5/2016 | |
| CN | 106019496 A | | 10/2016 | |
| CN | 107003478 A | | 8/2017 | |
| CN | 107436466 A | | 12/2017 | |
| CN | 107546568 A | | 1/2018 | |
| CN | 107664796 A | | 2/2018 | |
| CN | 107861201 A | | 3/2018 | |
| CN | 207488553 U | | 6/2018 | |
| CN | 108267821 A | | 7/2018 | |
| CN | 108548102 A | | 9/2018 | |
| CN | 110388576 A | | 10/2019 | |
| CN | 111338039 A | * | 6/2020 | ........... G02B 6/4268 |
| JP | S6360631 A | | 3/1988 | |
| TW | 200417766 A | * | 9/2004 | ........... G02B 6/4214 |
| WO | WO-2013077199 A1 | * | 5/2013 | ........... G02B 6/4251 |

OTHER PUBLICATIONS

First Chinese Office Action regarding Application No. 201811563574.4 dated Feb. 3, 2021. English translation provided by Chinable IP.

* cited by examiner

OPTICAL MODULE

This application is a continuation application of PCT international patent application No. PCT/CN2019/127213 filed with the National Intellectual Property Administration on Dec. 20, 2019, claiming priority to Chinese Patent Application No. 201811592719.3 filed with the National Intellectual Property Administration on Dec. 20, 2018 and entitled "OPTICAL MODULE", and priority to Chinese Patent Application No. 201811563574.4 filed with the National Intellectual Property Administration on Dec. 20, 2018 and entitled "OPTICAL MODULE", which are incorporated herein by reference in their entireties.

FIELD OF THE INVENTION

This application relates to a field of fiber communication, and in particular, to an optical module.

BACKGROUND OF THE INVENTION

At present, it has become a main solution for a high-speed optical module that an optical-to-electrical conversion function is implemented by using a silicon photonic chip. In a silicon photonic optical module, a silicon photonic chip is disposed on a surface of a circuit board, and is electrically connected to the circuit board by using a bonding wire. The silicon photonic chip is connected to an optical interface of the optical module by using a fiber ribbon, so that an optical signal can enter or exit the silicon photonic chip. Because a silicon material for the silicon photonic chip is not an ideal light-emitting material for a laser chip and a light-emitting unit cannot be integrated in a process of manufacturing the silicon photonic chip, the silicon photonic chip requires an external light source for providing light. A prior manner of providing a light source is to use a laser box in which a laser chip is packaged, wherein light emitted by the laser chip is guided to the silicon photonic chip. According to such a manner of providing a light source, the laser box is placed on a surface of the silicon photonic chip. However, the laser box and the silicon photonic chip may generate a lot of heat during operating processes, but the circuit board cannot satisfy requirements on heat dissipation because the circuit board has a very weak heat-conducting performance.

SUMMARY OF THE INVENTION

According to a first aspect, embodiments of this application provide an optical module, including an upper enclosure part, a lower enclosure part, and a laser box and a silicon photonic chip that are enclosed and packaged by the upper enclosure part and the lower enclosure part, where the laser box with a top plane and a side wall is disposed on a surface of the silicon photonic chip, wherein an enclosed cavity is defined by the top plane and the side wall of the laser box and the surface of the silicon photonic chip; on a side surface of the top plane inside the enclosed cavity is provided a laser chip, and a side surface of the top plane outside the enclosed cavity is in contact with the upper enclosure part for heat dissipation; and a focusing lens and a light-reflecting plane are provided in the enclosed cavity, wherein light emitted by the laser chip is suitable for being incident to the light-reflecting plane through the focusing lens.

According to a second aspect, embodiments of this application provide an optical module, including an upper enclosure part, a lower enclosure part, and a laser box and a silicon photonic chip that are enclosed and packaged by the upper enclosure part and the lower enclosure part, where the laser box includes a top plane, a side wall, and a base, wherein a laser chip is provided on the top plane on a side towards the base, and the top plane on a side away from the base is in contact with the upper enclosure part for heat dissipation;

an accommodation recess is formed on an upper surface of the base, for accommodating the laser chip, a focusing lens, and a light-reflecting plane, wherein light emitted by the laser chip is suitable for being incident to the light-reflecting plane through the focusing lens; and a lower surface of the base is in contact with a surface of the silicon photonic chip.

According to a third aspect, embodiments of this application provide an optical module, including an upper enclosure part, a lower enclosure part, an electrical connection board, a laser chip, and a laser box, a silicon photonic chip, and a circuit board that are enclosed and packaged by the upper enclosure part and the lower enclosure part, wherein the laser box with a top plane and a side wall is disposed on a surface of the silicon photonic chip, where a cavity is defined by the top plane and the side wall of the laser box and the surface of the silicon photonic chip; the electrical connection board extends into the cavity; the laser chip is disposed on a surface of the electrical connection board towards the silicon photonic chip in the cavity, and a surface of the electrical connection board away from the silicon photonic chip is attached on the top plane; and the electrical connection board at an end outside the cavity is electrically connected to the circuit board.

BRIEF DESCRIPTION OF THE DRAWINGS

To describe the technical solutions of the embodiments of the present disclosure to be more clear, the accompanying drawings required for the description of the embodiments or the prior art will be described briefly below. Apparently, the accompanying drawings as described below illustrate merely some of embodiments of the present disclosure, and other accompanying drawings may also be derived, without an effective effort, by one of ordinary skills in the art from these accompanying drawings.

FIG. 6-1 is a schematic structural diagram illustrating a laser box in accordance with an embodiment of the present application;

FIG. 6-2 is a schematic structural diagram illustrating another laser box in accordance with an embodiment of the present application;

DETAILED DESCRIPTION OF THE EMBODIMENTS

Examples of embodiments will be described below in with reference to the accompanying drawings. The embodiments may, however, be embodied in different forms and should not be construed as limited to the embodiments set forth herein. Rather, these embodiments are provided so that this disclosure will be thorough and complete, and will convey the scope of the present disclosure to those skilled in the art. Obviously, the embodiments to be described are merely some and not all of embodiments of the present disclosure. According to the embodiments in the present disclosure, all other embodiments derived, without an effective effort, by one of ordinary skills in the art fall into the protection scope of the present application.

The fiber communication technology, as a data transmission technology in a new generation of information technologies, satisfies requirements of modern information technologies due to its advantages such as large capacity, high rate, low costs, and the like, and has been developed as a basic technology that supports modern information technologies such as broadband Internet, a data center, cloud computing, big data, and the like.

One of core parts of fiber communication is conversion between an optical signal and an electrical signal. The fiber communication uses an optical signal carrying information for transmitting in an optical fiber/optical waveguide, and can achieve information transmission with low costs and low losses by using a passive characteristic in a process of an optical transmission. However, an information processing device such as a computer uses an electrical signal as a data source, and thus an inter-conversion between the electrical signal and an optical signal needs to be performed in a signal transmission process. On the one hand, by converting the electrical signal into an optical signal, data transmission may be performed by using an optical fiber; and on the other hand, by converting the optical signal into an electrical signal, the electrical signal as a data source is provided to the information processing device.

An optical module is used for achieving the foregoing optical-to-electrical conversion function in the technical field of fiber communication, and the inter-conversion between the optical signal and the electrical signal is also a core function of the optical module. The optical module is electrically connected to an external master computer by using a golden finger on a circuit board. Main electrical connections involve power supply, an I2C signal, transmission of a data signal, grounding, and the like. Such a manner of the electrical connection has become a standard manner in an industry of optical modules. On this basis, the circuit board is a necessary element for most optical modules. On this basis, research and development on the optical module are directed to two major aspects: packaging of an optical chip, and an electrical connection between a package and the circuit board.

A packaging manner of a silicon-based optoelectronic chip has become gradually mature in the industry of optical modules, wherein the silicon-based integrated circuit technology cooperates with the optical waveguide technology to manufacture a chip that integrates the optical-to-electrical conversion function and an electrical-to-optical conversion function by using a chip growth and manufacture process. However, a chip manufactured by using such a packaging manner may generate a lot of heat in a transmission process and a conversion process of a signal. If the generated heat is accumulated in the optical module, there is a result that a temperature within the optical module rises, thus affecting operating efficiency of the chip. To dissipate the heat generated by the chip and prevent the temperature within the optical module from being extremely high, this application provides an optical module that facilitates heat dissipation.

Figure 1:
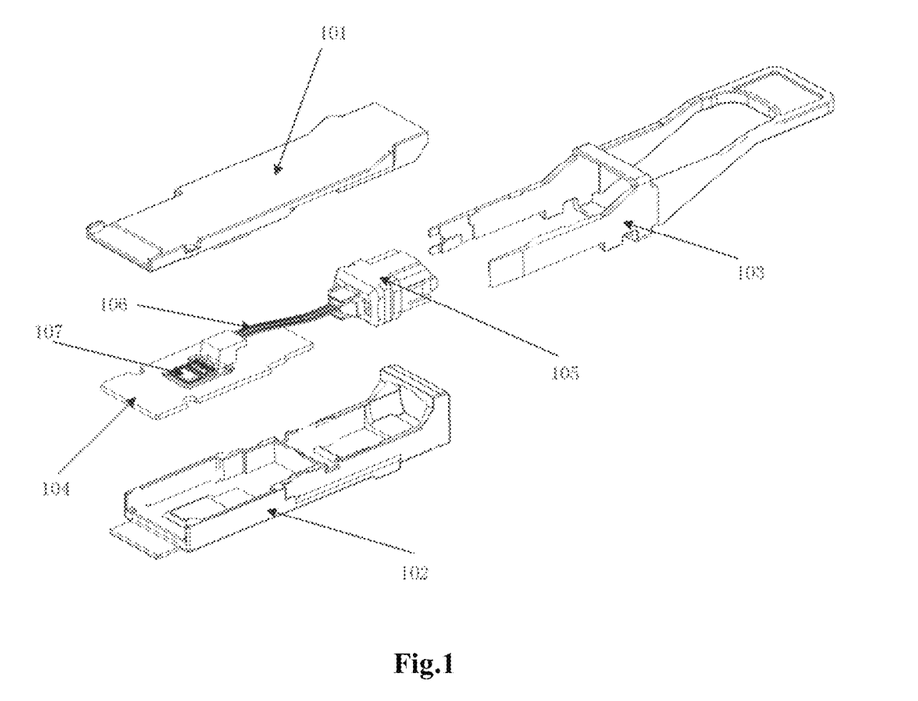
FIG. 1 is a schematic structural diagram illustrating an optical module in accordance with an embodiment of the present application.

FIG. 1 is a schematic structural diagram illustrating an optical module in accordance with an embodiment of the present application. As shown in the figure, the optical module provided according to this embodiment of this application having an enclosure including an upper enclosure part 101 and a lower enclosure part 102, include an unlocking handle 103, a circuit board 104, a fiber ribbon 106, a fiber interface 105, and a silicon photonic chip 107 fixed on a surface of the circuit board 104.

A combination of the upper enclosure part 101 with the lower enclosure part 102 can form a cavity for accommodating the packaged circuit board 104, the fiber ribbon 106, and the fiber interface 105. In a form of the upper enclosure part 101 and the lower enclosure part 102 to be assembled, it is easy for the devices such as the circuit board 104 and so on to be mounted in the enclosure. Relative to a one-piece enclosure, this manner can facilitate automatic assembly of devices such as the circuit board and the like, and also help mounting of a positioning component, a heat dissipation structure, and an electromagnetic shielding structure.

The unlocking handle 103 is located on an outer wall of the cavity/lower enclosure part 102. When the optical module is inserted into a master computer, the unlocking handle 103 is engaged with a cage of the master computer, thus the optical module is fixed with the master computer. An engagement of the optical module with the master computer can be released by pulling the unlocking handle 103, so that the optical module can be taken out from the master computer.

Figure 2:
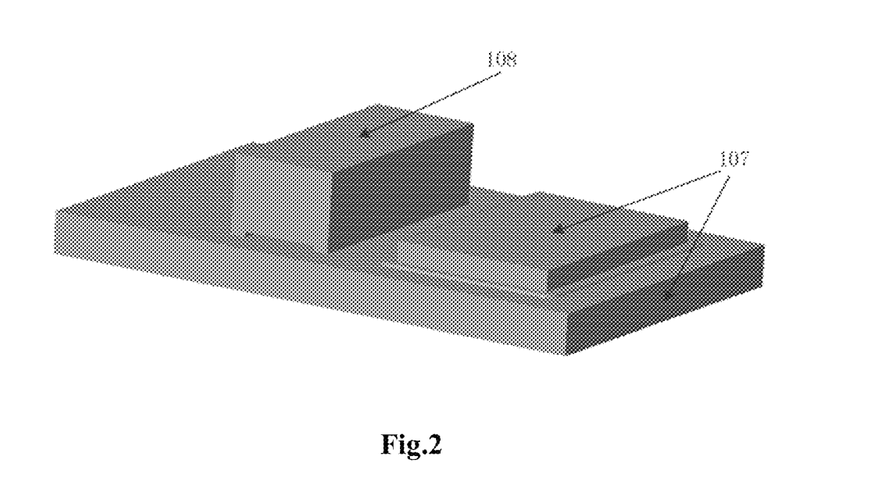
FIG. 2 is a schematic diagram illustrating an assembly structure of a silicon photonic chip and a laser box in accordance with an embodiment of the present application.
Figure 3:
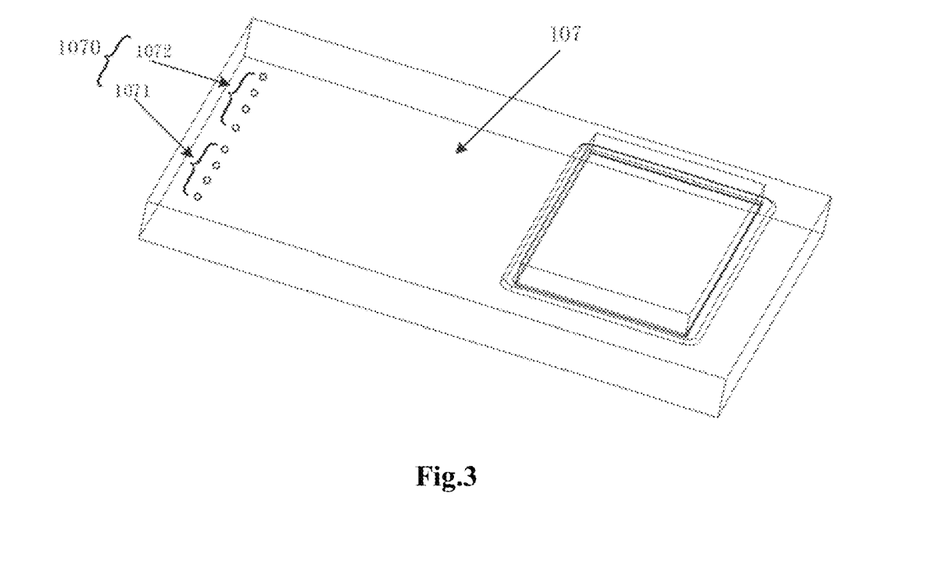
FIG. 3 is a schematic structural diagram illustrating a silicon photonic chip in accordance with an embodiment of the present application.

As shown in FIG. 2 and FIG. 3, the silicon photonic chip 107 is disposed on the circuit board 104, and a laser box 108 and light facets 1070 are disposed on a surface of the silicon photonic chip 107.

The fiber ribbon 106 at an end is connected to the fiber interface 105, and at the other end is connected to the light facets of the silicon photonic chip 107. There are a plurality of the light facets, which can be divided into light inlet facets 1071 and light outlet facets 1072 according to different directions for light to get in and out.

When optical communication is performed by the optical module, an optical signal can be generated and converted by using the internal silicon photonic chip and laser box, so as to be sent or received. FIG. 2 is a schematic diagram illustrating an assembly structure of a silicon photonic chip and a laser box in accordance with an embodiment of the present application. FIG. 3 is a schematic structural diagram illustrating a silicon photonic chip in accordance with an embodiment of the present application. As shown in FIG. 2 and FIG. 3, the light facets 1070 are disposed on the surface of the silicon photonic chip 107, and are configured to interface with the fiber ribbon 106 to achieve an optical connection. The light facets 1070 comprise light inlet facets 1071 and the light outlet facets 1072, where four light inlet facets 1071 and four light outlet facets 1072 are shown by way of example in the drawings. The laser box 108 is disposed on an upper surface of the silicon photonic chip 107. Laser light generated by the laser box 108 is incident into the silicon photonic chip 107, is incident into the fiber ribbon 106 through the light outlet facets 1072 of the silicon photonic chip 107, and is finally transmitted to an external of the optical module through the fiber interface 105. Light from the external can enter the optical module through the fiber interface 105, and is incident into the light inlet facets 1071 of the silicon photonic chip 107 through the fiber ribbon 106, so as to enter the silicon photonic chip 107.

In some embodiments, the laser box 108 generates light with a constant optical power, and the light with a constant optical power carries no data information. When performing optical communication, the laser box 108 generates light with a single wavelength. The laser box 108 has a capability of generating light with a plurality of wavelengths, but only light with a single wavelength can be emitted at a same moment, and light with different wavelengths can be emitted at different moments, respectively.

After the light with a constant optical power enters the silicon photonic chip 107, the silicon photonic chip 107 performs signal modulation on the light so that the data information is loaded to the light by changing the optical power, and the light is transmitted to the external of the optical module after successively passing through the light outlet facet 1072, the fiber ribbon 106, and the fiber interface 105.

There is an optical modulation unit provided in the silicon photonic chip 107. The light with a constant optical power is transmitted to the optical modulation unit through an optical waveguide within the silicon photonic chip 107, and is transmitted to the light facets 1070 through the optical waveguide within the silicon photonic chip 107 after being modulated by the optical modulation unit. The optical modulation unit is optionally a Mach-Zehnder modulator.

For received light that enters the silicon photonic chip 107 from the light inlet facet 1071, a conversion of an optical signal into an electrical signal is performed within the silicon photonic chip 107. Finally, the electrical signal is transmitted to the circuit board 104 of the optical module by the silicon photonic chip 107.

A light receiving unit is integrated within the silicon photonic chip 107, to convert the optical signal into a photocurrent. A transresistance amplifying unit is integrated within the silicon photonic chip 107, to convert the photocurrent into a photovoltage. A limiting amplifying unit is integrated within the silicon photonic chip 107, to convert the photovoltage into an electrical signal.

To implement the foregoing optical-to-electrical conversion function, light and electricity need to be provided for the silicon photonic chip 107. For example, transmitting light is provided for the silicon photonic chip 107 by the laser box 108, receiving light is provided for the silicon photonic chip 107 by the fiber ribbon 106, and electricity is provided for the silicon photonic chip 107 by the circuit board 104. The provided electricity mainly involves power supply, a data electrical signal, a monitoring electrical signal, a control electrical signal, and the like.

Figure 4:
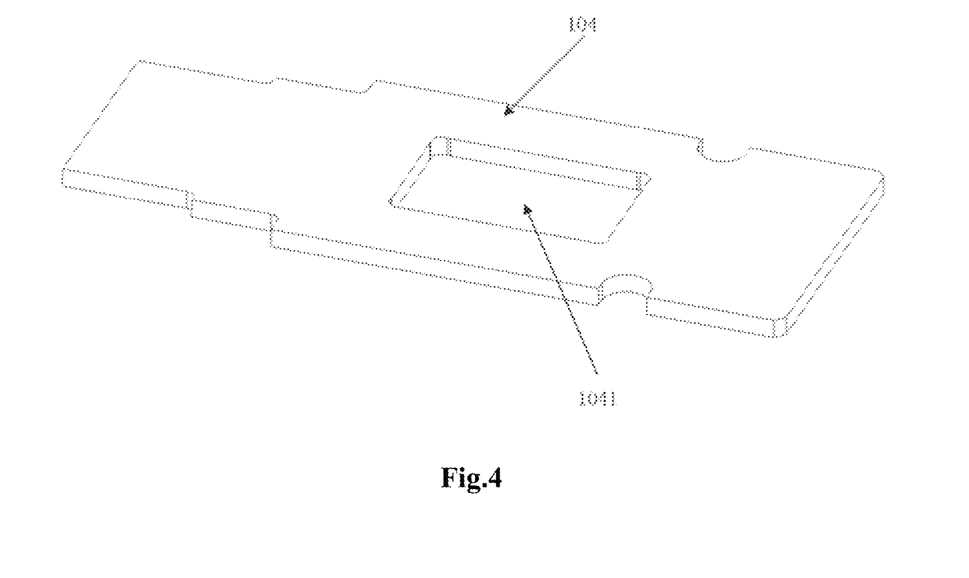
FIG. 4 is a schematic structural diagram illustrating a circuit board of an optical module in accordance with an embodiment of the present application.

The circuit board 104 has metal traces that are distributed on a surface layer and an inner layer of the circuit board 104. Electrical connections between electrical devices and between a golden finger and the electrical devices are achieved by using the metal traces. Optionally, the electrical devices include a microprocessor MCU, a power management chip (which is provided depending on a requirement of the optical module), a clock data recovery chip CDR (which is provided depending on a requirement of the optical module), a capacitor, a resistor, and the like. The electrical devices can also be connected to one another by using a bonding wire. For example, the circuit board 104 can be connected to the silicon photonic chip 107 by using the bonding wire.

Bonding pads are distributed at an edge of the silicon photonic chip 107, and the circuit board 104 is correspondingly provided with bonding pads. The silicon photonic chip 107 is connected to the circuit board 104 by using a bonding wire.

A signal to be sent by the optical module serving as an optical-to-electrical conversion tool is derived from the master computer. The golden finger of the circuit board of the optical module has a signal input pin. A signal inputted via the signal input pin is transmitted to the bonding pad of the circuit board 104 via the metal trace. A transmitting signal is outputted to the silicon photonic chip 107 by means of a connection between the bonding pads of the circuit board 104 and the silicon photonic chip 107. The silicon photonic chip 107 modulates the optical signal based on the transmitting signal.

The silicon photonic chip 107 converts a receiving optical signal into an electrical signal. The electrical signal is transferred to the metal trace of the circuit board 104 via the bonding wire, is transferred to a signal output pin of the circuit board 104 via the metal trace, and is transferred to the master computer via the signal output pin. A lot of heat may be generated during a process of performing an optical-to-electrical conversion by the silicon photonic chip 107. Particularly, when the silicon photonic chip 107 is applied to a high-speed signal transmission scenario, for example, applied to transmission of a signal with a rate of 4G, 100G or even 400G a great deal of heat are generated. Moreover, such a semiconductor material as the silicon photonic chip 107 is very sensitive to heat, and if the heat is not conducted away in time, performance of the silicon photonic chip 107 may be degraded heavily. As a result, problems such as a signal error code, optical power drop, and the like may occur. Furthermore, the material of the circuit board 104 is not a good heat conductive material, either, and thus generally it is adverse to heat conduction to attach the silicon photonic chip 107 directly onto the surface of the circuit board 104, because only a little of heat from the silicon photonic chip 107 is absorbed by the circuit board 104 and the circuit board 104 has a lower efficiency on dissipating heat. Finally, there is still a lot of heat accumulated in the silicon photonic chip 107.

To quickly dissipate the heat of the silicon photonic chip 107 and improve the heat dissipation efficiency of the silicon photonic chip 107, in one aspect, in accordance with an embodiment of the present disclosure there is provided an optical module having an upper enclosure part 101 and a lower enclosure part 102, as shown in FIG. 2 to FIG. 6, including a laser box 108 and a silicon photonic chip 107 that are enclosed and packaged by the upper enclosure part 101 and the lower enclosure part 102. The laser box 108 with a top plane 1081 and a side wall 1088 is disposed on a surface of the silicon photonic chip 107. The top plane 1081 and the side wall 1088 of the laser box 108 and the surface of the silicon photonic chip 107 define an enclosed cavity.

Figure 61:
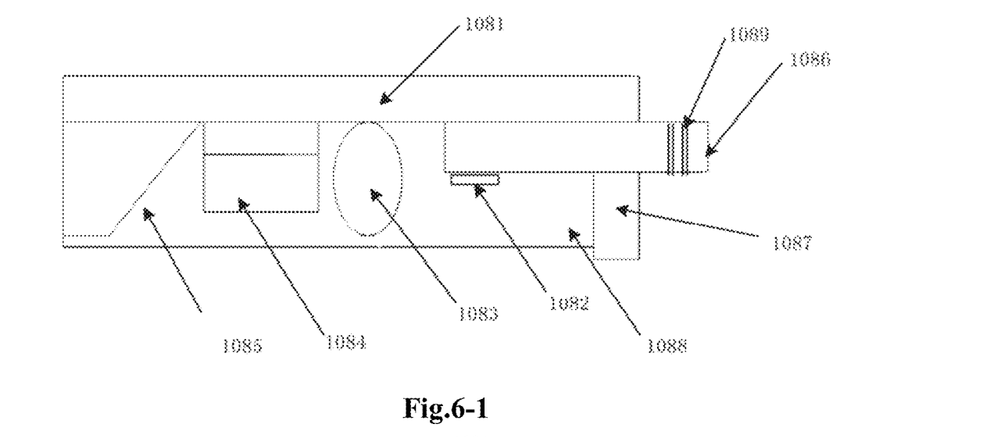

On a side surface of the top plane 1081 inside the enclosed cavity is provided a laser chip 1082; and on a side of the top plane 1081 outside the enclosed cavity, the top plane 1081 is in contact with the upper enclosure part 101 for heat dissipation. A focusing lens 1083 and a light-reflecting plane 1085 are provided in the enclosed cavity, wherein light emitted by the laser chip 1082 is incident to the light-reflecting plane 1085 through the focusing lens 1083.

In another aspect, in accordance with an embodiment of the present disclosure, there is provided a further optical module having an upper enclosure part 101 and a lower enclosure part 102, as shown in FIG. 2 to FIG. 5 and FIG. 7, including a laser box 108 and a silicon photonic chip 107 that are enclosed and packaged by the upper enclosure part 101 and the lower enclosure part 102. The laser box 108 has a top plane 1001, a side wall, and a base 1090. On a side of the top plane 1001 towards the base 1090 is provided a laser chip 1082; and on a side of the top surface 1001 away from the base 1090, the top plane 1001 is in contact with the upper enclosure part 101 for heat dissipation. On an upper surface of the base 1090 there is an accommodation recess 1093 for accommodating the laser chip 1082, a focusing lens 1083, and a light-reflecting plane 1085. Light emitted by the laser chip 1082 is incident to the light-reflecting plane 1085 through the focusing lens 1083. A lower surface of the base 1090 is in contact with a surface of the silicon photonic chip 107.

According to the optical module in accordance with the embodiment of this application, the upper enclosure part 101 and the lower enclosure part 102 enclose the laser box 108 and the silicon photonic chip 107 to be packaged. The laser box 108 is disposed on and is in contact with the surface of the silicon photonic chip 107 by the side wall 1088 or the base 1090. The laser chip 1082 is disposed on the top plane of the laser box 108. The top plane is in contact with the upper enclosure part 101 for heat dissipation, so as to help heat generated by the laser chip 1082 be conducted to the upper enclosure part 101 via the top plane, wherein light emitted by the laser chip 1082 is incident to the light-reflecting plane 1085 through the focusing lens 1083 so as to supply light for the silicon photonic chip 107.

A circuit board 104 provided according to this embodiment of this application has an opening 1041 that passes through an upper surface and a lower surface of the circuit board 104, and the silicon photonic chip 107 is disposed in the opening 1041.

FIG. 4 is a schematic structural diagram illustrating a circuit board of an optical module in accordance with an embodiment of the present application. As shown in FIG. 4, the circuit board 104 has an opening 1041. The opening 1041 may be disposed in the middle of the circuit board 104, that is, the opening 1041 is surrounded by the circuit board 104. Alternatively, the opening 1041 may be disposed on the edge of the circuit board 104, that is, the opening 1041 is open on one side thereof, and on other sides thereof are surrounded by the circuit board 104.

Figure 5:
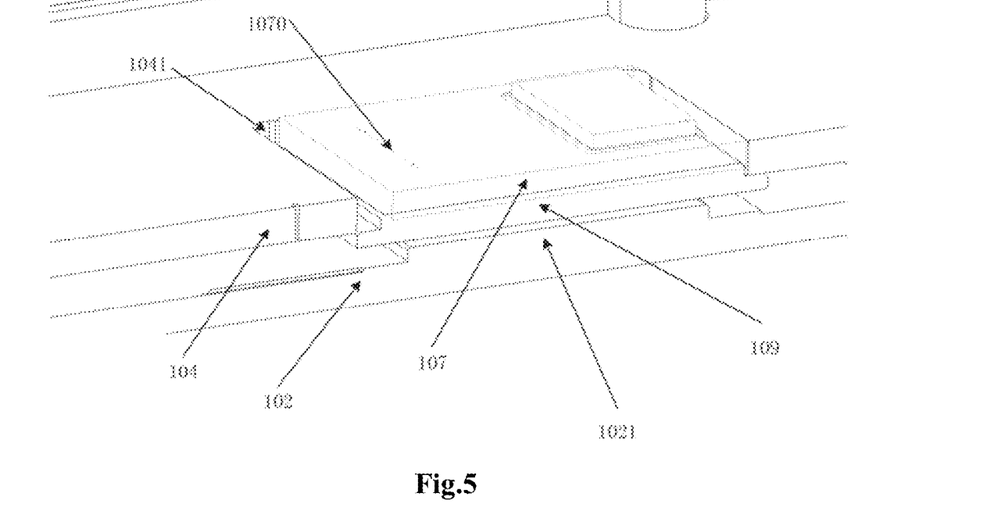
FIG. 5 is a schematic diagram illustrating an assembly structure of a circuit board, a silicon photonic chip, and a lower enclosure part in an optical module in accordance with an embodiment of the present application.

FIG. 5 is a schematic diagram illustrating an assembly structure of a circuit board, a silicon photonic chip, and a lower enclosure part in an optical module in accordance with an embodiment of the present application. As shown in FIG. 5, the silicon photonic chip 107 is disposed in the opening 1041. A lower surface of the silicon photonic chip 107 is directly in contact with the lower enclosure part 102 of the optical module by a heat conductive structure 109. The heat conductive structure 109 may be a heat conductive substrate cushioned between the silicon photonic chip 107 and the lower enclosure part 102, or may be a heat conductive column upwardly protruding from the lower enclosure part 102.

The heat conductive structure 109 shown in FIG. 5 is a platform-protruding-shaped heat conductive substrate. The protruding platform bears the silicon photonic chip 107 and a base of the protruding platform supports the circuit board 104. The lower enclosure part 102 shown in FIG. 5 has a heat conductive protrusion 1021. The heat conductive protrusion 1021 is in contact with the heat conductive structure 109. Certainly, a heat conductive adhesive or a heat conductive foam can be cushioned between the heat conductive protrusion 1021 and the heat conductive structure 109. The silicon photonic chip 107 is in contact with the lower enclosure part 102 in a heat conductivity manner by the heat conductive structure 109, and heat generated during an operation can be quickly conducted to the lower enclosure part 102.

Due to the opening provided in the circuit board 104, the silicon photonic chip 107 can be in thermal contact with the lower enclosure part 102 under the lower surface of the circuit board 104 by the heat conductive structure 109, so as to achieve heat conductivity. The silicon photonic chip 107 may be in direct contact with the heat conductive structure 109, or may be in indirect thermal contact with the heat conductive structure 109 by means of a heat conductive adhesive or another adhesion form.

In some embodiments, the silicon photonic chip 107 may be partially located in the opening of the circuit board. For example, a part of the silicon photonic chip 107 is located in the opening, and the other part protrudes outside an upper surface or a lower surface of the circuit board 104. The silicon photonic chip 107 is in contact with the heat conductive structure 109 through the opening of the circuit board 104, so as to achieve heat conductivity.

The silicon photonic chip 107 is connected to the upper surface of the circuit board 104 by a bonding wire. In some embodiments, as shown in FIG. 5, at least a part of the upper surface of the silicon photonic chip 107 flushes with the upper surface of the circuit board 104, and the silicon photonic chip 107 is connected to a circuit on the circuit board 104 by a bonding wire. Particularly, at least the part of the upper surface of the silicon photonic chip 107, which flushes with the upper surface of the circuit board 104, is connected to the circuit on the circuit board 104 by a bonding wire, so that a length of the bonding wire can be shortened as possible, thus improving signal integrity.

In the implementation manner shown in FIG. 5, the heat generated by the silicon photonic chip 107 can be dissipated via the lower enclosure part 102. Moreover, in the optical module, another heat source is the laser box 108, and a main heat emitting element in the laser box 108 is the laser chip 1082. Therefore, in order to obtain a better heat dissipation effect, on the basis of a heat dissipation design for the silicon photonic chip 107, a heat dissipation design for the laser box 108 is further proposed according to an embodiment of this application.

The laser box 108 (Laser Box) is located on the upper surface of the silicon photonic chip 107. There are optical devices such as the laser chip 1082 (e.g., a laser diode), the focusing lens 1083, an isolator 1084, and the light-reflecting plane 1085 within the laser box 108. The light emitted by the laser chip 1082 is incident to the light-reflecting plane 1085 after passing through the focusing lens 1083 and the isolator 1084, and is reflected by the light-reflecting plane 1085 into the silicon photonic chip 107.

Similarly, a lot of heat is also generated in an operating process of the laser chip 1082, and the heat generated by the laser chip 1082 is adverse to diffusion via the silicon photonic chip 107. Because the heat dissipation efficiency of the silicon photonic chip 107 is limited, it is difficult to significantly improve the heat dissipation efficiency of the silicon photonic chip 107 by a conventional structural design or a change in material. Dissipation of the heat via the silicon photonic chip 107 may increase a heat dissipation load of the silicon photonic chip 107. According to a heat dissipation capability of the silicon photonic chip 107, for a process of transmitting signal at a relatively low speed, the heat from the laser box 108 may be diffused via the silicon photonic chip 107. However, for a product with a high-speed signal transmission, a design is not desirable that the heat from the laser box 108 is diffused via the silicon photonic chip 107. When an environment temperature around the optical module is relatively high, the heat from the laser chip 1082 as a main heat dissipation element in the laser box 108 is difficult to be diffused, and thus the temperature of laser chip will be higher and the output power of the laser chip 1082 will drop. For example, compared with an output power at 25° C., the output power of the laser chip 1082 at 75° C. may drop by 2-3 dB. Regarding this, generally an input current needs to be added to maintain stability of the laser chip 1082 at a high temperature. However, there is typically a strict power consumption limit for the optical module, and a specified power consumption is easily exceeded due to increase in an input current.

FIG. 6-1 is a schematic structural diagram illustrating a laser box in accordance with an embodiment of the present application. As shown in FIG. 6-1, the laser box 108 provided according to this embodiment of the present application have the top plane 1081 and the side wall 1088, and includes an electrical connection board, a blocking member 1087, the laser chip 1082, the focusing lens 1083, the isolator 1084, and the light-reflecting plane 1085.

The blocking member 1087 is located between the top plane 1081 and the surface of the silicon photonic chip 107 and clamp and hold the electrical connection board in cooperation with the top plane 1081. The electrical connection board may be a metalized ceramic 1086, and a through via 1089 may be provided therein. The laser box 108 has a main function of providing light for the silicon photonic chip 107, and the provided light comes from the laser chip 1082. The laser box 108 provides a package structure and an electrical connection structure for the laser chip 1082.

The laser chip 1082 is relatively sensitive to moisture because moisture may refract light and disturb a preset optical path of the light. Therefore, the laser box 108 for packaging the laser chip 1082 needs to satisfy a sealing package requirement. In order to provide a sealed space, the laser box 108 includes the top plane 1081 and the side wall 1088 surrounding the top plane 1081 to form a cavity with an opening at a bottom side. The laser chip 1082 is disposed in the cavity.

For sealing of the laser box 108 on the bottom side, it is a feasible sealing manner to dispose the laser box 108 on the surface of the silicon photonic chip 107, which serves as a bottom face of the laser box 108 and together with the laser box108 forms a sealed cavity. The laser box 108 may be fixed to the silicon photonic chip 107 based on bonding by glue. Dispensing glue is performed at an outer side of the side wall of the laser box 108. After the glue is cured, an outer side surface of the side wall of the laser box 108 may be attached with glue, and a bottom surface of the side wall which faces towards the silicon photonic chip 107 may be attached with glue.

The light emitted by the laser chip 1082 is incident to the surface of the silicon photonic chip 107 after being reflected by the light-reflecting plane 1085. There cannot be glue on a place on the surface of the silicon photonic chip 107 that receives the light because a power of light entering the silicon photonic chip 107 may be reduced due to a presence of the glue there. The glue on an area of the silicon photonic chip 107 not contacting the sidewall is attached on the surface of the silicon photonic chip 107 under no pressure, wherein the glue may be formed to have a bump structure with an uneven thickness when being cured under no pressure, and the light may be reflected and refracted to various extents at different positions of the bump structure, thus the power of light entering the silicon photonic chip 107 is reduced.

In such a sealing manner, in order to facilitate heat dissipation for the laser chip 1082, the laser chip 1082 is fixed on the top plane 1081 of the laser box 108. To facilitate implementation of an optical path, the focusing lens 1083 and the isolator 1084 are also fixed on the top plane 1081 of the laser box 108. The light-reflecting plane 1085 may be a separate prism fixed on the top plane 1081, or may be an inclined surface of the top plane 1081 of the laser box 108. In view of above, the heat generated by the laser chip 1082 can be diffused upwards via the top plane 1081 of the laser box 108. Moreover, the silicon photonic chip 107 is located below the top plane 1081 of the laser box 108, and thus a primary heat conduction path for the laser chip 1082 is separate from that for the silicon photonic chip 107, wherein the heat from the laser chip 1082 is conducted upwards, while the heat from the silicon photonic chip 107 is conducted downwards. In this way, a heat conduction area is expanded, and a heat conduction burden on the silicon photonic chip 107 increased by the heat from the laser box 108 is also relieved.

The upper enclosure part 101 of the optical module may be provided with a heat conductive column protruding downwardly. The heat conductive column is in contact with the top plane of the laser box 108. The heat generated by the laser chip 1082 is conducted to the upper enclosure part 101 via the top plane 1081 of the laser box 108, and is diffused away via the upper enclosure part 101.

Figure 7:
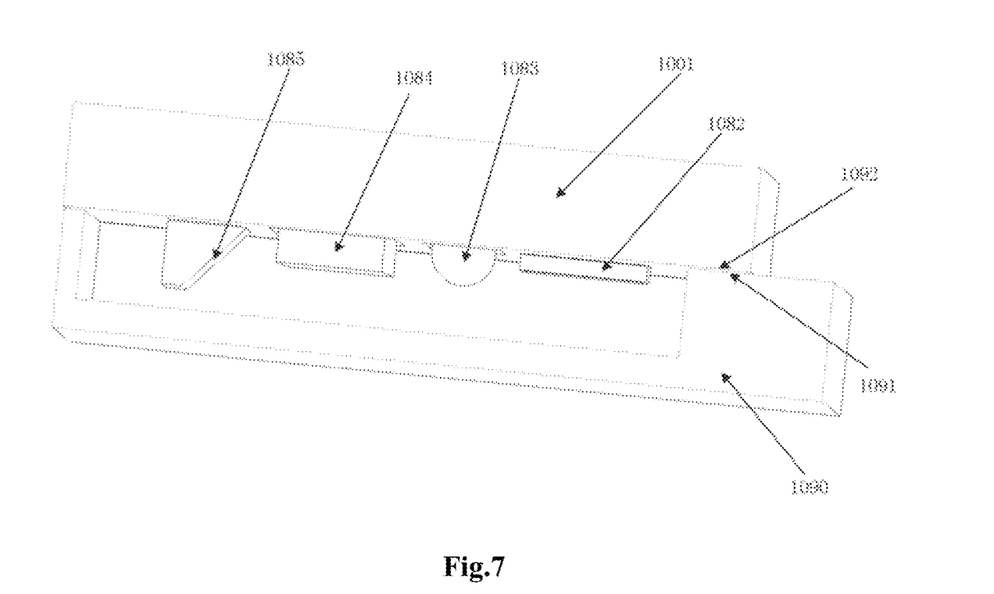
FIG. 7 is a schematic structural diagram illustrating another laser box in accordance with an embodiment of the present application.

For sealing of the laser box 108 on the bottom side, there may be optionally a further sealing manner as shown in FIG. 7. The laser box 108 includes a base 1090. The base 1090, the side wall, and the top plane 1001 together define the cavity for sealing the laser chip 1082. The base 1090 is fixed onto the surface of the silicon photonic chip 107 by glue. Since the base 1090 puts a pressure on the glue, the glue has an even thickness after being cured. In this way, power of light that passes through the glue is not affected.

In such a sealing manner, in order to facilitate heat dissipation for the laser chip 1082, the laser chip 1082 is fixed on the top plane 1001 of the laser box 108. To facilitate implementation of an optical path, the focusing lens 1083 and the isolator 1084 are also fixed on the top plane 1001 of the laser box 108. The light-reflecting plane 1085 may be a separate prism fixed on the top plane 1001, or may be designed as an inclined surface of the top plane of the laser box 108. In view of above, the heat generated by the laser chip 1082 can be diffused upwards via the top plane 1001 of the laser box 108. Moreover, the silicon photonic chip 107 is located below the top plane 1001 of the laser box 108, and thus a primary heat conduction path for the laser chip 1082 is separated from that for the silicon photonic chip 107, wherein the heat from the laser chip 1082 is conducted upwards, while the heat from the silicon photonic chip 107 is conducted downwards. In this way, a heat conduction area is expanded, and a heat conduction burden on the silicon photonic chip 107 increased by the heat from the laser box 108 is also relieved. Similarly, the upper enclosure part 101 of the optical module may be provided with a heat conductive column protruding downwardly. The heat conductive column is in contact with the top plane of the laser box 108. The heat generated by the laser chip 1082 is conducted to the upper enclosure part 101 via the top plane 1001 of the laser box 108, and is diffused away via the upper enclosure part 101.

Although an electrical connection for the laser box 108 can be achieved by a bonding wire process, the bonding wire process can only be applicable to a connection for two connection surfaces that face a same direction. The laser chip 1082 is fixed on the top plane of the laser box 108, and the laser chip 1082 has a bonding wire connection surface facing down while the laser box 108 has a bonding wire connection surface on outside facing up. Due to a requirement of a bonding wire connection process, it is hard to implement a connection for such connection surfaces facing in opposite directions.

Regarding this, in the optical module provided according to this embodiment of this application, there is further provided an external electrical connection structure of the laser box. Specifically, the laser chip 1082 is attached on a surface of the metalized ceramic 1086 and the metalized ceramic 1086 is fixed on the top plane, so that the laser chip 1082 may be fixed on the top plane of the laser box 108.

The metalized ceramic 1086 is formed by laying a metal on a surface of a ceramic so that a circuit and an electrical connection area are formed. The metalized ceramic 1086 has a metal area that joints a negative electrode on a bottom of the laser chip 1082, so that the negative electrode of the laser chip 1082 is grounded. The metalized ceramic 1086 further has a pad that is connected, by a bonding wire, to a positive electrode on a surface of the laser chip 1082, wherein the circuit on the surface of the metalized ceramic 1086 is connected to the pad, so that electrical connection points for the positive electrode of the laser chip 1082 may expand beyond the laser box 108.

Figure 62:
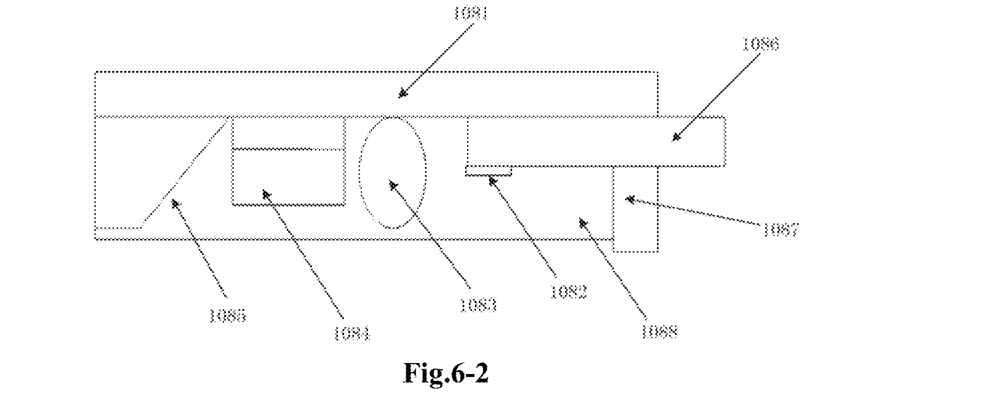

For an electrical connection of the laser chip 1082 within the laser box 108 to external of the laser box 108, two specific electrical connection manners are provided according to this embodiment of this application, as shown in FIG. 6-1 and FIG. 6-2.

In a feasible electrical connection implementation manner, there is provided an optical module in accordance with an embodiment of this application, including an upper enclosure part 101, a lower enclosure part 102, an electrical connection board, and a laser box 108 in which a laser chip 1082 is provided, a silicon photonic chip 107 and a circuit board 104 that are enclosed and packaged by the upper enclosure part 101 and the lower enclosure part 102. The laser box 108 is disposed on a surface of the silicon photonic chip 107, and a top plane 1081 and a side wall 1088 of the laser box 108 and the surface of the silicon photonic chip 107 define a cavity. The electrical connection board extends into the cavity. On a surface of the electrical connection board towards the silicon photonic chip 107 is provided the laser chip 1082, and the electrical connection board by a surface away from the silicon photonic chip 107 is attached on the top plane 1081. The electrical connection board has an end portion outside the cavity and is electrically connected to the circuit board 104 by the end portion. The laser chip is electrically connected to the electrical connection board, by which supply of power for the laser chip may be implemented from outside of the cavity, and the electrical connection board at the end portion outside the cavity is electrically connected to the circuit board, so that the circuit board can supply power for the laser chip.

The electrical connection board may be a metalized ceramic 1086. The metalized ceramic 1086 extends into the laser box 108 from an external of the laser box 108. The laser chip 1082 is attached on a surface of the metalized ceramic 1086, wherein a positive electrode of the laser chip 1082 is connected to a circuit on the surface of the metalized ceramic 1086 by a bonding wire, and the circuit extends to outside of the laser box 108.

At a tail end of the metalized ceramic 1086 outside the laser box 108, the circuit extends along a bottom surface of the metalized ceramic 1086 onto a top surface thereof across a side surface thereof, and is electrically connected to the circuit board 104 by a pad on the top surface of the metalized ceramic 1086 and a bonding wire. In other words, on the surface of the electrical connection board towards the silicon photonic chip 107 is disposed a circuit, and on the surface of the electrical connection board away from the silicon photonic chip 107 outside the cavity is provided a pad. In addition, a through via may be further provided in the metalized ceramic 1086 at the tail end outside the laser box 108, so that the circuit on the bottom surface may be conducted to the top surface, and is electrically connected to the circuit board by the pad on the top surface of the metalized ceramic 1086 and the bonding wire.

In another feasible electrical connection implementation manner, the laser chip 1082 is attached on a surface of a first metalized ceramic 1086, and the first metalized ceramic 1086 is within the laser box 108. A second metalized ceramic 1086 extends into the laser box 108 from external of the laser box 108, and is connected, by a bonding wire, to the first metalized ceramic 1086 with the laser chip 1082 fixed thereon. At a tail end of the second metalized ceramic 1086 outside the laser box 108, a circuit extends along a bottom surface of the second metalized ceramic 1086 onto a top surface thereof across a side surface thereof on which an electrical connection layer may are provided, and is electrically connected to the circuit board 104 by a pad on the top surface of the second metalized ceramic 1086 and a bonding wire. In other words, on the surface of the electrical connection board towards the silicon photonic chip 107 is provided a circuit, and on the surface of the electrical connection board away from the silicon photonic chip 107 outside the cavity is provided a pad. In addition, a through via may be further provided in the second metalized ceramic 1086 at the tail end outside the laser box 108, so that the circuit on the bottom surface may be conducted to the top surface, and is electrically connected to the circuit board by the pad on the top surface of the metalized ceramic 1086 and the bonding wire.

It would be understood that the two connection manners as described above are only two examples of the embodiments, and other feasible connection manners are not described herein in detail.

Figure 8:
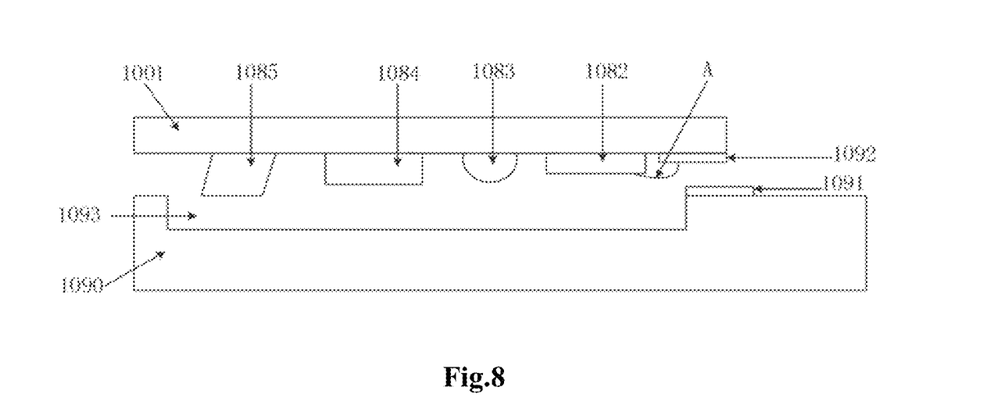
FIG. 8 is a schematic diagram illustrating an electrical connection structure of another laser box in accordance with an embodiment of the present application.

FIG. 8 is a schematic diagram illustrating an electrical connection structure of another laser box in accordance with an embodiment of the present application. In the embodiments shown in FIG. 7 and FIG. 8, the top plane 1001 of the laser box is in contact with the upper enclosure part 101 of the optical module. In order to further enhance the heat dissipation performance of the laser box 108, in this embodiment of this application, a thermal conductive adhesive can be further provided between the laser box 108 and the upper enclosure part 101. The thermal conductive adhesive can improve heat conduction efficiency of the laser box 108, helping the heat of the laser box 108 be conducted to the upper enclosure part 101. In addition, because the thermal conductive adhesive is typically elastic, the thermal conductive adhesive can enhance strength of connection between the upper enclosure part 101 and the laser box 108.

In this embodiment, by fixing the laser chip 1082 in the laser box 108 onto the top plane 1001, the heat generated by the laser chip 1082 can be conducted to the top plane 1001. There is no other strong heat emitting element over the top plane 1001, helping improve heat dissipation effect of the laser chip 1082. In addition, the accommodation recess 1093 formed on the base 1090 enables that a contact area between the base 1090 and the top plane 1001 is relatively small, helping to reduce an amount of heat dissipated upwards from the silicon photonic chip 107 and relieve a heat dissipation burden on the laser chip 1082 caused by the silicon photonic chip 107, thereby further improving the heat dissipation effect of the laser chip 1082.

Because the laser chip 1082 along with a corresponding trace is located over the base 1090 in an assembly, the trace of the laser chip 1082 can be directly electrically connected to another functional component by a strip pad on the base 1090. In this application, the laser chip 1082 is disposed on the top plane 1001, and thus, a corresponding strip pad need to be disposed on the top plane 1001, and the laser chip 1082 is electrically connected to a corresponding trace through communication between the strip pads.

Referring to FIG. 8, FIG. 8 is an exploded schematic diagram illustrating a laser box in accordance with an embodiment of this application. As seen from FIG. 8, in this embodiment, a first strip pad 1092 is disposed on the top plane 1001; a second strip pad 1091 is disposed on the base 1090; the laser chip 1082 is electrically connected to the first strip pad 1092 by a bonding wire A; the first strip pad 1092 is electrically connected to the second strip pad 1091; and the second strip pad 1091 is electrically connected to a PCB strip pad by a bonding wire. The first strip pad 1092 may be electrically connected to the second strip pad 1091 in an eutectic welding manner. The first strip pad 1092 and the second strip pad 1091 are disposed on interfaces between the top plane 1001 and the base 1090 in the assembly. In this way, when the top plane 1001 and the base 1090 are assembled, the first strip pad 1092 is electrically connected to the second strip pad 1091, so as to communicate the laser chip 1082 with another functional component.

The silicon photonic chip 107 is located on the surface of the circuit board 104. A pad on an edge of the silicon photonic chip 107 is connected to a pad on the surface of the circuit board 104 by a bonding wire. The bonding wire may be a metal wire or a wire made of another material, and be used for transmission of a signal between the silicon photonic chip 107 and the circuit board 104. Because there is a relatively large amount of edge pads on the silicon photonic chip 107, there are correspondingly a relatively large quantity of the bonding wires. Moreover, the silicon photonic chip 107 has a very small volume, and thus the edge pads are arranged to be dense. Therefore, the bonding wires are also arranged to dense and have a very small diameter so that the bonding wire is very fragile. Thereby, a problem caused is that these bonding wires may be easily damaged during an assembling or a use process if there is no external protection. Therefore, according to this embodiment of this application, the bonding wire is protected by using a protection cover 1010, thus avoiding damages to the bonding wire that are caused by pressing or touching.

Figure 9:
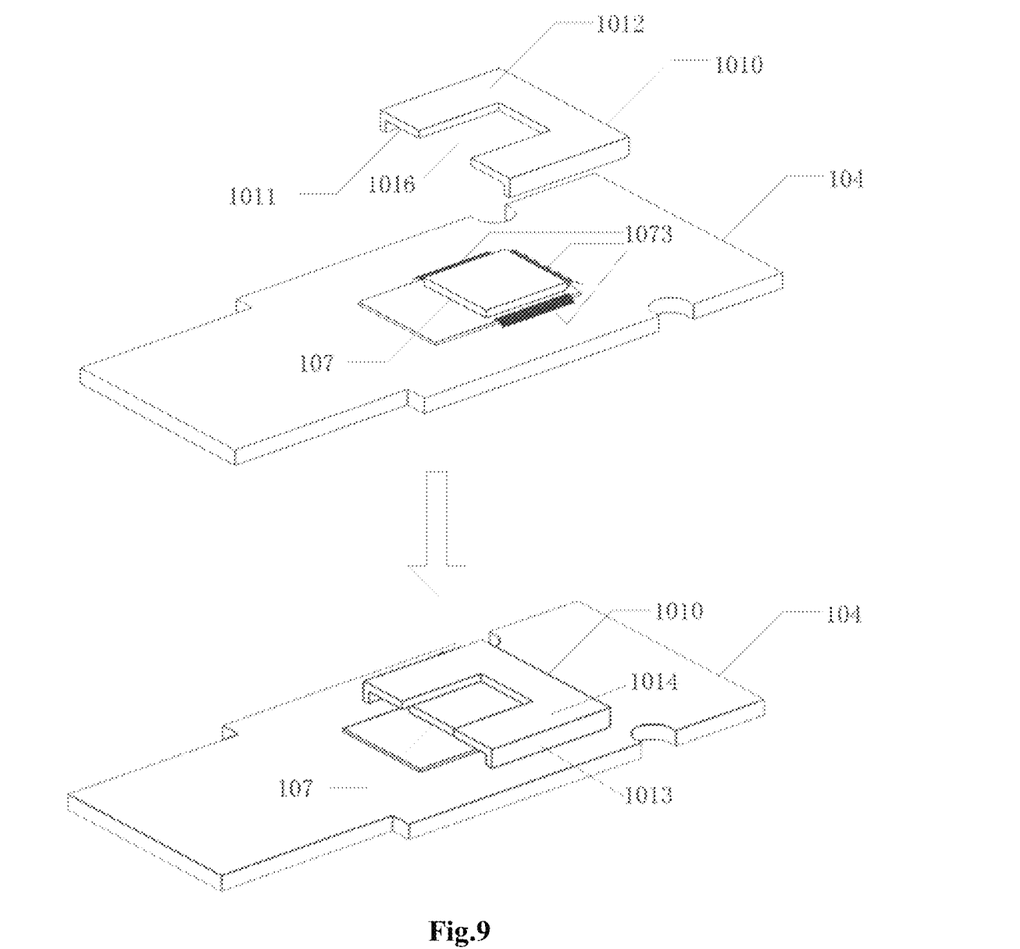
FIG. 9 is a schematic diagram illustrating an assembly structure of a protection cover in accordance with an embodiment of this application.
Figure 10:
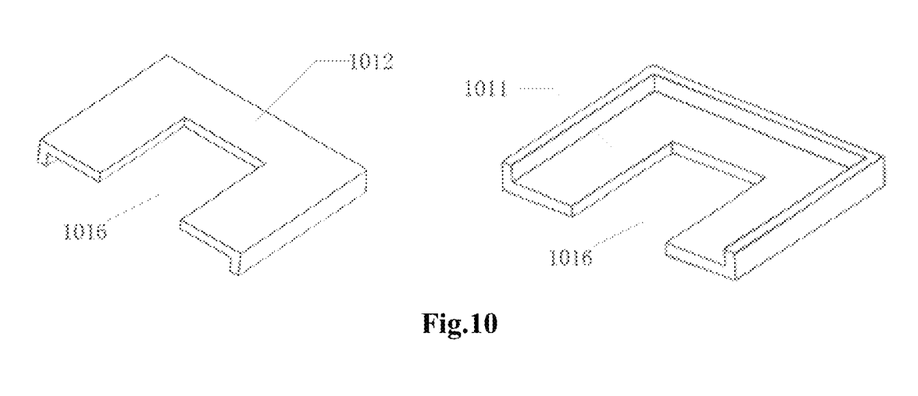
FIG. 10 is a schematic diagram illustrating a protection cover for protecting a gold wire in accordance with an embodiment of this application.

The protection cover 1010 is hard housing structure. As shown in FIG. 9 and FIG. 10, the housing structure includes an inner surface 1011 and an outer surface 1012. The protection cover 1010 is fixed on the circuit board 104, with the inner surface 1011 facing towards the circuit board 104, and covers an area 1073 of the silicon photonic chip 107 where the bonding wires are located. The bonding wires are enclosed in an internal space of the housing structure to be protected.

It should be noted that the protection cover 1010 by the inner surface 1011 thereof can further cover the edge pads on the silicon photonic chip 107 and the pad on the surface of the circuit board 104, wherein the protection cover 1010 is not in contact with the edge pads on the silicon photonic chip 107 and the pads on the surface of the circuit board 104, so that it cannot occur that a signal is undesirably shorted between the pads when the protection cover 1010 is made of a metallic material. Moreover, expansion of an internal space of the protection cover 1010 may lower difficulty in assembling the protection cover 1010.

In addition, the protection cover 1010 by the inner surface 1011 thereof may be in no contact with the area 1073 where the bonding wire is located, so as to reserve a space for deformation of the protection cover 1010. In this way, when the protection cover 1010 deforms due to an external pressure on the outer surface 1012 thereof, the inner surface 1011 of the protection cover 1010 is still in no contact with the bonding wire, thereby further improving protection effect for the bonding wire.

For the optical module provided according to this embodiment of this application, beyond the area where the bonding wires are located is covered by the protection cover 1010. The protection cover 1010 is a housing structure, and can protect the bonding wire in a plurality of directions. Compared with a manner of applying an adhesive to the bonding wire, the protection cover 1010 has a stronger hardness, and even if being pressed to be deformed, the protection cover 1010 can still protect the area where the bonding wire is located from being damaged, so as to protect the bonding wire in the optical module.

As shown in FIG. 9, the protection cover 1010 can include a support portion 1013 and a covering portion 1014. The support portion 1013 is in facial contact with the circuit board 104, and the covering portion 1014 by its an inner surface covers the area where the bonding wire is located.

Because the bonding wire may rise above the pad of the circuit board 104 or pad of the silicon photonic chip 107 by one hundred to hundreds of micrometers, and the bonding wire may have a span length of hundreds to thousands of micrometers. Therefore, the support portion 1013 has a height above the bonding wire, and the covering portion 1014 has a width greater than the span length of the bonding wire. A region under the protection cover 1010 from an inner wall thereof is hollow to reserve a sufficient space so that the area 1073 where the bonding wire is located is not touched.

Figure 11:
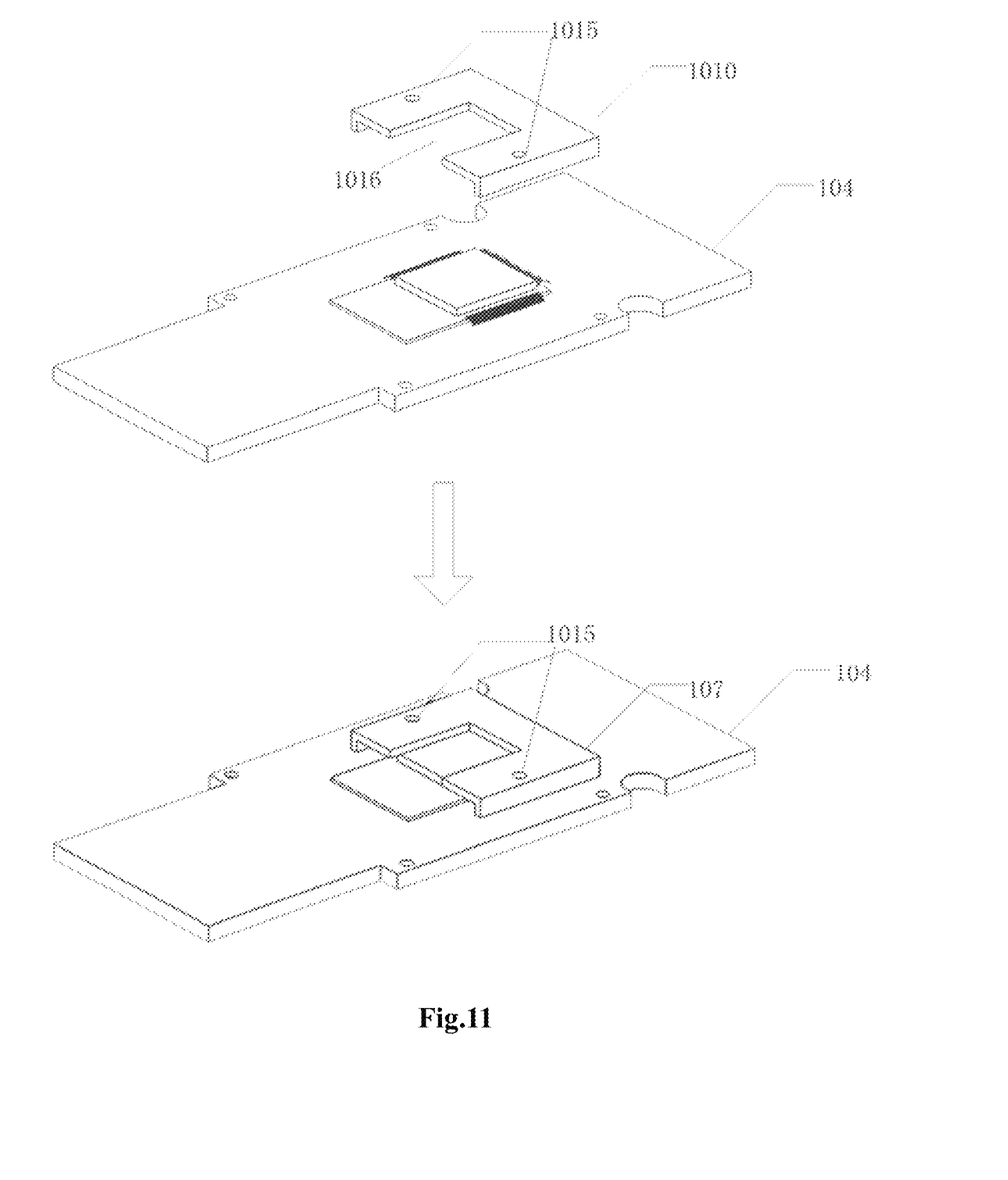
FIG. 11 is a schematic diagram illustrating that a protection cover protects a gold wire in accordance with an embodiment of this application.

As shown in FIG. 11, the protection cover 1010 can further include positioning holes 1015. The positioning holes 1015 are configured to mount the protection cover 1010 at a preset position on the circuit board 104 by using a jig. A number of the positioning holes 1015 is greater than or equal to two, so as to determine a position and an orientation of the protection cover 1010. The positioning holes 1015 are arranged not limited to positions shown in this embodiment of this application. For example, the positioning holes 1015 may be symmetrically arranged with regard to a central axis of the protection cover 1010. The positioning holes 1015 may be located on the covering portion 1014 as shown in FIG. 11 or on the support portion 1013.

For example, the protection cover 1010 is placed into the jig by means of positioning holes in the protection cover 1010 and positioning pins on the jig, and then the jig is mounted onto the circuit board 104 by means of positioning pins on the jig/holes in the circuit board 104. At this time, the protection cover 1010 can abut upon the circuit board 104 and cover the area 1073 where the bonding wire is located. Glue (for example, epoxy glue) can be applied to a junction, at an outer side, of the protection cover 1010 in contact with the circuit board 104. After the jig is taken off, the protection cover 1010 is left on the circuit board 104 and covers the area 1073 where the bonding wire is located. Subsequently, the glue can be cured in a manner of a ultraviolet (UV) cure or a baking cure, to finally fix the protection cover 1010.

Because the optical module is in a structure of the enclosure enclosed, the heat generated by the silicon photonic chip 107 in an operating process is restricted in the enclosure, thus not facilitating heat dissipation. Therefore, an opening 1016 may be provided in the protection cover 1010, and via the opening 1016, an area of the silicon photonic chip 107 having no bonding wire can be in contact with the enclosure of the optical module by a heat conductive adhesive, so as to dissipate the heat of the silicon photonic chip 107 through the enclosure of the optical module.

A whole or part of the protection cover 1010 may be made of transparent material, so as to be convenient for observation of the protected bonding wire. In one aspect, the bonding wire may be protected from being touched during assembling. In another aspect, in a use process, it can be observed, without removal of the protection cover 1010, whether the protected bonding wire is damaged or not. The protection cover 1010 may also be made of other hard materials such as a polymer material, a metal material (such as copper), or the like, to improve strength of the protection cover 1010.

The protection cover 1010 is in facial contact with the circuit board 104 so that the bonding wire can be prevented from being touched and damaged by an external object.

Finally, it should be noted that the foregoing specific embodiments are only examples for describing the present disclosure, and the scope of the present disclosure is not limited thereto. While the present disclosure is described in detail with reference to the foregoing specific embodiments, it should be understood that various modifications and alternative forms may be made to the present disclosure, the present disclosure is to cover all modifications, equivalents, and alternatives falling within the spirit and scope of the present disclosure.

What is claimed is:

1. An optical module, comprising an upper enclosure part, a lower enclosure part, and a laser box and a silicon photonic chip that are enclosed and packaged by the upper enclosure part and the lower enclosure part, wherein:
    the laser box with a top plane and a side wall is disposed on a surface of the silicon photonic chip, wherein an enclosed cavity is defined by the top plane and the side wall of the laser box and the surface of the silicon photonic chip;
    the laser box comprises:
    a laser chip provided on the top plane on a side inside the enclosed cavity, and the top plane on a side outside the enclosed cavity is in contact with the upper enclosure part for heat dissipation; and
    a focusing lens and a light-reflecting plane provided in the enclosed cavity, wherein light emitted by the laser chip is suitable for being incident to the light-reflecting plane through the focusing lens; and
    wherein the optical module further comprises a circuit board and a heat conductive substrate, wherein the circuit board has an opening that passes through an upper surface and a lower surface of the circuit board, the silicon photonic chip is disposed in the opening, and the heat conductive substrate is disposed between the silicon photonic chip and the lower enclosure part and directly in contact with the lower enclosure part.

2. The optical module according to claim 1, wherein the heat conductive substrate is in a platform protruding shape, the silicon photonic chip is disposed on a protruding platform of the heat conductive substrate, and the circuit board is supported on a recess part of the heat conductive substrate.

3. The optical module according to claim 1, wherein the laser box further comprises an isolator, wherein the isolator, the focusing lens, and the light-reflecting plane are disposed on the top plane, respectively, and the isolator is located between the light-reflecting plane and the focusing lens.

4. An optical module, comprising an upper enclosure part, a lower enclosure part, and a laser box and a silicon photonic chip that are enclosed and packaged by the upper enclosure part and the lower enclosure part, wherein
    the laser box comprises a top plane, a side wall, and a base, wherein
    a laser chip is provided on the top plane on a side towards the base, and the top plane on a side away from the base is in contact with the upper enclosure part for heat dissipation;
    an accommodation recess is formed on an upper surface of the base, for accommodating the laser chip, a focusing lens, and a light-reflecting plane, wherein light emitted by the laser chip is suitable for being incident to the light-reflecting plane through the focusing lens; and
    a lower surface of the base is in contact with a surface of the silicon photonic chip,
    wherein the optical module further comprises a circuit board and a heat conductive substrate, wherein the circuit board has an opening that passes through an upper surface and a lower surface of the circuit board, the silicon photonic chip is disposed in the opening, and the heat conductive substrate is disposed between the silicon photonic chip and the lower enclosure part and directly in contact with the lower enclosure part.

5. The optical module according to claim 4, wherein the heat conductive substrate is in platform protruding shape, the silicon photonic chip is disposed on a protruding platform of the heat conductive substrate, and the circuit board is supported on a recess part of the heat conductive substrate.

6. The optical module according to claim 4, wherein the laser box further comprises an isolator, wherein the isolator, the focusing lens, and the light-reflecting plane are disposed on the top plane, respectively; and the isolator is located between the light-reflecting plane and the focusing lens.

7. An optical module, comprising an upper enclosure part, a lower enclosure part, an electrical connection board, a laser chip, and a laser box, a silicon photonic chip, and a circuit board that are enclosed and packaged by the upper enclosure part and the lower enclosure part, wherein
    the laser box with a top plane and a side wall is disposed on a surface of the silicon photonic chip, wherein a cavity is defined by the top plane and the side wall of the laser box and the surface of the silicon photonic chip;

the electrical connection board horizontally extends into the enclosed cavity;

the laser chip is disposed on a surface of the electrical connection board towards the silicon photonic chip in the cavity, and a surface of the electrical connection board away from the silicon photonic chip is attached on the top plane; and the electrical connection board at an end outside the cavity is electrically connected to the circuit board, wherein the optical module further comprises a heat conductive substrate, wherein the circuit board has an opening that passes through an upper surface and a lower surface of the circuit board, the silicon photonic chip is disposed in the opening, and the heat conductive substrate is disposed between the silicon photonic chip and the lower enclosure part and directly in contact with the lower enclosure part.

8. The optical module according to claim 7, wherein on the surface of the electrical connection board towards the silicon photonic chip is provided a circuit;

wherein, on the surface of the electrical connection board away from the silicon photonic chip outside the cavity is provided a pad; and wherein the circuit is electrically connected to the pad through a through via, and the pad is electrically connected to the circuit board.

9. The optical module according to claim 7, wherein on the surface of the electrical connection board towards the silicon photonic chip is provided a circuit;

on the surface of the electrical connection board away from the silicon photonic chip outside the cavity is provided a pad;

on a side surface of an end portion of the electrical connection board outside the cavity is provided an electrical connection layer, so as to connect the circuit and the pad; and the pad is electrically connected to the circuit board.

10. The optical module according to claim 7, further comprising a blocking member that is located between the top plane and the surface of the silicon photonic chip, to clamp and hold the electrical connection board in cooperation with the top plane.

11. The optical module according to claim 7, wherein the pad is electrically connected to the circuit board by a bonding wire or a flexible printed circuit board.

* * * * *